United States Patent [19]

Desu et al.

[11] Patent Number: 5,262,199
[45] Date of Patent: Nov. 16, 1993

[54] COATING POROUS MATERIALS WITH METAL OXIDES AND OTHER CERAMICS BY MOCVD

[75] Inventors: Seshu Desu; Chien-Hsiung Peng, both of Blacksburg, Va.; Tian Shi, Beijing, China

[73] Assignee: Center For Innovative Technology, Herndon, Va.

[21] Appl. No.: 870,570

[22] Filed: Apr. 17, 1992

[51] Int. Cl.$^5$ .................. C23C 16/00; B05D 5/00
[52] U.S. Cl. .................. 427/255.1; 427/244; 427/255.4; 427/255.7; 427/376.2; 427/399
[58] Field of Search .................. 427/244, 376.2, 255.2, 427/255.4, 255.7, 399, 255.1

[56] References Cited

U.S. PATENT DOCUMENTS

| | | | |
|---|---|---|---|
| 4,052,530 | 10/1977 | Fonzi | 428/336 |
| 4,504,522 | 3/1985 | Kaiser et al. | 427/255.3 |
| 4,533,605 | 8/1985 | Hoffman | 428/635 |
| 4,980,204 | 12/1990 | Fujii et al. | 427/255.2 |
| 5,075,160 | 12/1991 | Stinton et al. | 428/282 |
| 5,087,277 | 2/1992 | Gonzalez et al. | 55/523 |

OTHER PUBLICATIONS

Seshu B. Desu, Decomposition Chemistry of Tetrethoxysilane, J. Am. Ceram. Soc., 72(9) 1615-21 (1989). (no month available).

Primary Examiner—Shrive Beck
Assistant Examiner—David M. Maiorana
Attorney, Agent, or Firm—Whitham & Marhoefer

[57] ABSTRACT

Metal organic chemical vapor deposition (MOCVD) is used to form a layer of a metal oxide on the surfaces and within the pores of a porous ceramic material. The metal oxide is formed from one or more inexpensive metal organic precursors which permeate the pores of the substrate as a vapor. Surface reactions on the heated substrate convert the metal organic precursors to their metal oxide. The technique has particular utility in creating catalysts with very large surface areas and in providing a protective coating on ceramic materials that prevents or reduces damage from hostile environments. In a preferred embodiment, aluminum isopropoxide, $[(CH_3)_2CHO]_3Al$, and titanium ethoxide, $Ti(C_2H_5O)_4$, are used simultaneously or successively as precursors to generate a $Al_2TiO_5$ coating on a porous ceramic substrate such as SiC or porous refractory cement candle filters.

24 Claims, 5 Drawing Sheets

COATING POROUS MATERIALS WITH METAL OXIDES AND OTHER CERAMICS BY MOCVD

BACKGROUND OF THE INVENTION

1. Field of the Invention

The present invention is generally related to coating the internal and external surfaces of porous ceramic materials with a protective or catalytic metal oxide or ceramic layer and, more particularly, to using metal organic chemical vapor deposition (MOCVD) to apply metal oxides or other ceramics on the internal and external surfaces of a porous ceramic material without plugging the pores.

2. Description of the Prior Art

Many ceramic materials have desirable properties such as mechanical strength and heat resistance which make them ideal for use under extreme environmental conditions. Nevertheless, the surfaces of many ceramic materials must be modified to achieve corrosion and/or oxidation resistance before they can be used in hostile environments. Thin metal oxide coatings can be applied to the surfaces of ceramic materials to achieve the desired protection. Currently, there are many commonly used thin film deposition techniques for depositing metal oxide layers, including radio frequency (RF) sputtering, thermal or electron beam evaporation, and chemical vapor deposition (CVD). Variations on CVD include plasma enhanced CVD (PECVD), low pressure CVD (LPCVD), and MOCVD.

It would be desirable to have a method for coating porous ceramic materials with a metal oxide layer without clogging the pores. Catalysts with huge surface to volume ratios could be produced with such a technique. In addition, filter elements, such as high temperature ceramic candle filters, could be produced. In a candle filter, the protective metal oxide layer lining the pores could protect the filter from being degraded by the corrosive and oxidative environment in which the filter is used (coal furnace, etc.).

U.S. Pat. No. 4,533,605 to Hoffman discloses RF sputtering metal oxides such as $Al_2O_3$, $SiO_2$, $Ta_2O_5$, $TiO_2$, MgO, etc., on an article surface to impart scratch and corrosion resistance. However, sputtering is a nonconformal, physical vapor deposition technique which would be completely unsuitable for coating the internal and external surfaces of a porous material. Sputtering would tend to coat only the exposed external surfaces of a porous material with a metal oxide layer. In the case of catalyst manufacture, sputtering would not coat the internal surfaces of the porous material and there would be no advantages realized in terms of surface to volume ratio. In the case of filter manufacture, sputtering would likely cause the formation of a layer over the pores at the material surface which would block the free flow of gases through the filter. Furthermore, sputtering techniques typically have low deposition rates and require high vacuum processes, both of which reduce product throughput.

U.S. Pat. No. 5,075,160 to Stinton et al. discloses that a high temperature filter for removing particulate materials from gases, such as those produced in a coal furnace, is fabricated by coating the fibers of a felt with a thin layer of protective material. Specifically, a silicon carbide (SiC) felt such as "Nicalon", available from the Nippon Carbon Company, has its fibers coated with an additional SiC layer or an aluminum oxide ($Al_2O_3$) layer, where the coated layer is deposited by CVD. The coated layer both protects the felt from chemicals in the fluid being filtered and serves to hold the fibers together under mechanically stressful conditions. The layers are formed by blowing reactant gases through the felt. In the case of a SiC layer, methyltrichlorosilane ($CH_3SiCl_3$) and hydrogen ($H_2$) is blown through the felt. In the case of an $Al_2O_3$ layer, aluminum trichloride ($AlCl_3$), $H_2$, and carbon dioxide ($CO_2$) is blown through the felt. After blowing the reactant gases through the felt, the felt is heated to 1200° C. to create SiC and $Al_2O_3$, respectively, through a reaction on the felt fiber surfaces.

SUMMARY OF THE INVENTION

It is therefore an object of this invention to provide a method for coating porous ceramic materials with a metal oxide or other ceramic layer without clogging the pores.

It is another object of this invention to use MOCVD to coat porous ceramic materials with metal oxides and other ceramics.

It is yet another object of this invention to provide methods for forming a layer of $Al_2TiO_5$ on ceramic surfaces including the internal and external surfaces of porous ceramic filter elements.

According to the invention, a low pressure MOCVD technique is used to deposit protective metal oxide and ceramic thin films on porous ceramic materials. In the process, inexpensive metal or ceramic organic precursors are vaporized, deposited on porous ceramic elements, and converted to their respective metal oxide or ceramic. The process is carried out under a surface reaction controlled regime where the diffusional mass transport is relatively faster than the surface reaction rates. The process can be used for providing a wide variety of coatings on porous ceramic substrates depending on the selection of organic precursors and heat treatments. The conformal nature of the MOCVD process ensures film uniformity and homogeneity over the inner as well as the outer surfaces of the porous elements.

In the formation of a protective $Al_2TiO_5$ film on the inner and outer surfaces of a filter element, the metal oxides $Al_2O_3$ and $TiO_2$ are first deposited on the inner and outer surfaces of the filter element using the organic precursors aluminum isopropoxide and titanium ethoxide (although other organic precursors could be suitable), respectively. The organic precursors are vaporized, transported onto a filter element positioned in an MOCVD reactor, and oxidized or otherwise reacted on the filter element surface to form layers of $Al_2O_3$ and $TiO_2$ on the inner and outer surfaces of the filter element. Experiments show that a 1 μm coating can be created on the inner and outer surfaces of a porous SiC filter having a pore size of 100 μm. Hence, the coating process provides a protective coating on the inner surfaces of the porous material as well as the external surfaces, and does not plug the SiC filter element. In $Al_2TiO_5$ film formation, the $Al_2O_3$ and $TiO_2$ metal oxide layers may either be deposited simultaneously or sequentially. In the case of sequential deposition, a sandwich structure of metal oxide layers is created. After deposition of $Al_2O_3$ and $TiO_2$, the filter element is heated to form a thin, β-phase, $Al_2TiO_5$ layer on the internal and external surfaces of the filter.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1:
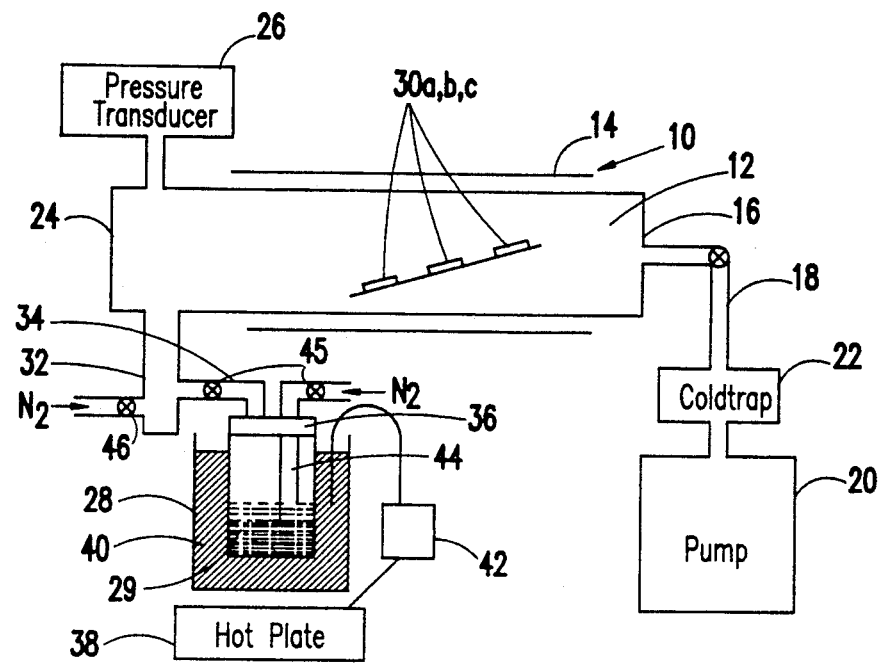
FIG. 1 is a schematic drawing of a CVD reactor showing a metal organic precursor compound being deposited on substrates within the reactor as a metal oxide layer.

Referring now to the drawings, and more particularly to FIG. 1, there is shown a reactor 10 with a reactor chamber 12. The reactor chamber 12 is surrounded by a furnace 14. On one end 16 of the reactor chamber 12 is a passageway 18 which leads to vacuum pump 20. A coldtrap 22 is integrated in passageway 18 and protects the pump 20 from corrosive materials evacuated from the reactor chamber 12. A nitrogen filled dewer or other means can serve as the coldtrap 22. On the other end 24 of the chamber 12 is a pressure transducer 26. The pressure transducer 26 can be of the diaphragm variety, as well as other suitable arrangements. Substrates 30a-c, which are to be coated with a metal oxide or other ceramic, are situated in horizontal chamber 12 parallel to the vapor flow. The substrates 30a-c may be SiC candle filter elements, porous refractory cement candle filter elements such as those described in U.S. Pat. No. 5,087,277 to Gonzalez et al. which is herein incorporated by reference, other types of ceramic filter materials, matrix materials for catalysts where the deposited metal oxide will serve as the catalyst, or other suitable substrates.

The arrangement of the CVD reactor 10 is similar to that described in Desu, JACS 72[9] 161521 (1989), and that reference is herein incorporated by reference. The chief differences being that the diameter of the present reactor 10 is 80 mm, the uniform temperature zone provided by furnace 14 is 300 mm, and the substrates 30a-c are placed parallel to the vapor flow.

A bubbler 28 is connected to the reaction chamber 12 via a passageway 32. Passageway 32 is connected to a pipe 34 extending through a lid 36 of bubbler 28, which contains an organic precursor compound 29. Particular examples of suitable organic precursor compounds 29 include titanium ethoxide ($Ti(C_2H_5O)_4$), which can be oxidized to titanium oxide ($TiO_2$), and aluminum isopropoxide ($[(CH_3)_2CHO]_3Al$), which can be oxidized to aluminum oxide ($Al_2O_3$). Titanium ethoxide and aluminum isopropoxide were chosen for experimental purposes because it has been found that a combination of titanium oxide and aluminum oxide can be used to make $\beta$-aluminum titanate according to equation 1.

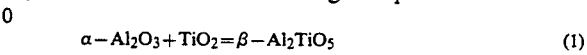

$$\alpha - Al_2O_3 + TiO_2 = \beta - Al_2TiO_5 \quad (1)$$

However, it should be understood that many different metal oxides, as well as other industrially important ceramic compounds, can be deposited on porous ceramic substrates according to the present invention. Table 1 presents several ceramic compounds which can be deposited using the MOCVD technique of the present invention and their organic precursor.

TABLE 1

| Ceramic Compound | Organic Precursor |
| --- | --- |
| $Al_2O_3$ | $Al(C_3H_7O)_3$ |
| $ZrO_2$ | $[Zr(C_{11}H_{19}O_2)_4]$ or $[Zr(C_4H_9O)_4]$ |
| $TiO_2$ | $[Ti(C_3H_7O)_4]$ |
| $Y_2O_3$ | $[Y(C_{11}H_{19}O_2)_3]$ |
| $Sc_2O_3$ | $[Sc(C_{11}H_{19}O_2)_3]$ |
| $SrO$ | $[Sr(C_{11}H_{19}O_2)_2]$ |
| $Ta_2O_5$ | $[Ta(C_2H_5O)_5]$ |
| $CaO$ | $[Ca(C_{11}H_{19}O_2)_2]$ |
| $Si_3N_4$ | $\{Si[N(CH_3)_2]_4 + NH_3\}$ |
| $TiN$ | $\{Ti[N(CH_3)_2]_4 + NH_3\}$ |
| $ZrN$ | $\{Zr[N(C_2H_5)_2]_4 + NH_3\}$ |
| $AlN$ | $[(CH_3)_2AlNH_2]_3$ |
| $SiC$ | $[CH_3SiCl_3]$ |
| $TiC$ | $[C_2H_5TiCl_3]$ |
| $ZrC$ | $[C_5H_5ZrCl_3]$ |

A hot plate 38, positioned under a silicon oil bath 40, is used to heat the organic precursor compound 29 to aid in the formation of a vapor. Temperature control device 42, which can be a thermocouple or the like, is connected to the hot plate 38 and the oil bath 40. In the case of the $Ti(C_2H_5O)_4$ precursor, the temperature is preferably maintained at 100° C. in the bubbler 28. In the case of the $[(CH_3)_2CHO]_3Al$ precursor, the temperature is preferably maintained at 140° C. in the bubbler 28. The temperature of the bubbler 28 will vary as a function of the precursor to be deposited.

A pipe 44 extends through the lid 36 of bubbler 28 and serves the function of bubbling in a carrier gas (e.g. $N_2$ at 5 SCCM) to aid in creating a vapor from the organic precursor compound 29. The vapor is withdrawn from the bubbler 28 by vacuum pressure from pump 20 and deposited on substrates 30a-c. The end opening of pipe 34 leading to passageway 32 and reaction chamber 12 is situated above the surface level of the organic precursor compound 29 so that only vaporized portions are drawn into reaction chamber 12. Valves 45 control the bubbling through action of the carrier gas. Additional carrier gas can be mixed with the vaporized organic precursors at passageway 32 (e.g., passage 46 can provide a diluting $N_2$ gas at 150 SCCM).

In operation, the carrier gas transports the vaporized organic precursor compound 29 into the reaction chamber 12 which is preferably maintained under vacuum conditions (e.g., 0.5 to 1 Torr) by the vacuum pump 20. In the reaction chamber 12, the organic precursor compounds are deposited on the surfaces of the substrates 30a-c, whereupon they oxidize, decompose or are otherwise converted to their respective metal oxide or ceramic (see Table 1 above). The conversion is aided by maintaining the substrates 30a–c at a high enough temperature to achieve the conversion. For example, when using $Ti(C_2H_5O)_4$ to form $TiO_2$ layers, the substrate temperature is maintained at 380° C.–400° C. using the furnace 14, and when using $[(CH_3)_2CHO]_3Al$ to form $Al_2O_3$ layers, the substrate temperature is maintained at 300° C.

In an experiment, thin films of $Al_2O_3$ were deposited on lightly doped p-type (100) silicon wafers in a reactor at 0.6 Torr with a nitrogen gas flow rate of 150 SCCM. Aluminum isopropoxide was used as the organic precursor compound and it was kept at 140° C. during the deposition process. The silicon wafers were maintained at 300° C. during deposition. The nitrogen gas was sent through the reactor only as a diluting gas, and a separate flow of nitrogen was not bubbled through the aluminum isopropoxide, as is shown in FIG. 1, since the aluminum isopropopoxide precursor inherently has a high vapor pressure. With reference back to FIG. 1, this is shown as not bubbling in nitrogen through pipe 44, but adding nitrogen at valve 46. Aluminum isopropoxide was present as a powdered material in bubbler 28. The film growth rate was approximately 8.0 nm/min under these deposition conditions.

Figure 3A:
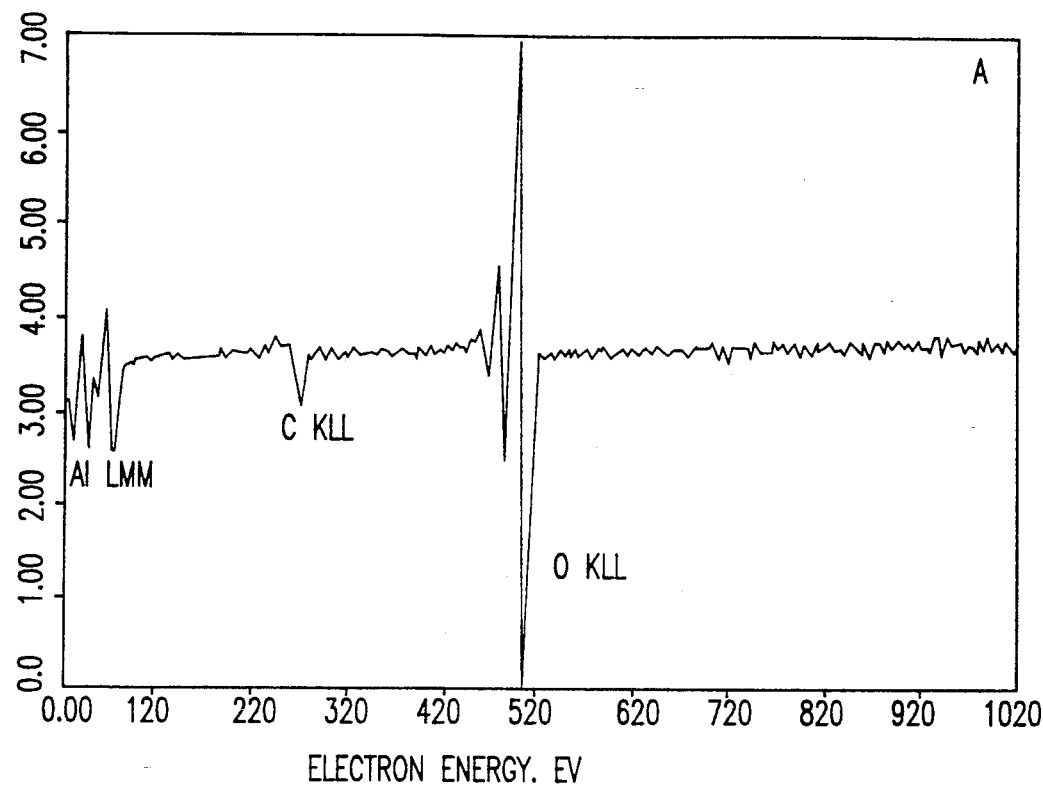
FIGS. 3a and 3b are Auger Electron Spectra (AES) and X-ray Photoelectron Spectra (XPS) of an $Al_2O_3$ film deposited on a silicon substrate by MOCVD, respectively.
Figure 3B:
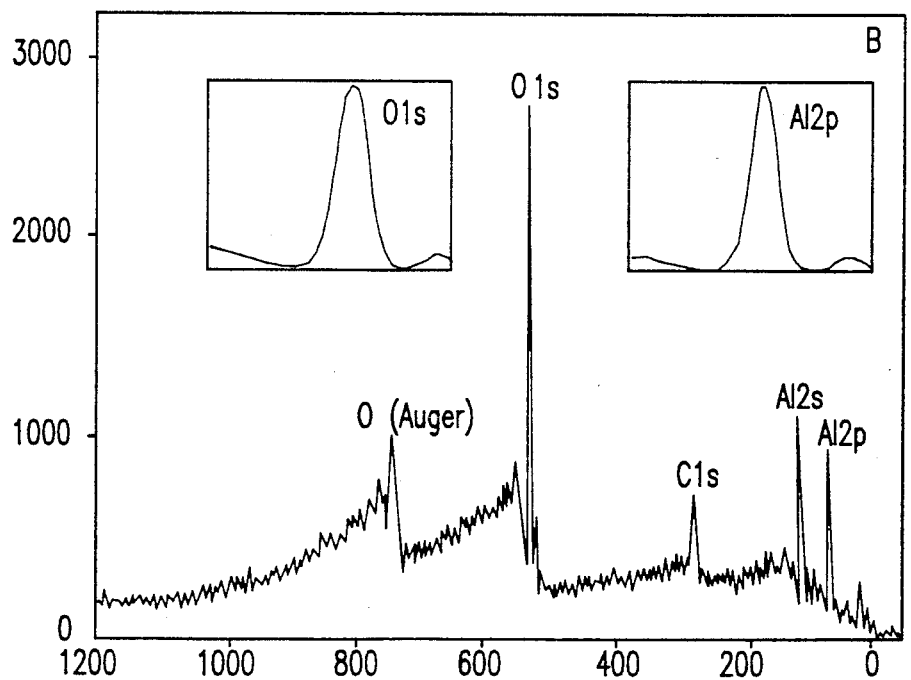

The appearance of the MOCVD $Al_2O_3$ film on the single crystal silicon wafer was uniform, mirrorlike, and crack-free under optical microscope examination. X-ray diffraction showed the MOCVD $Al_2O_3$ film was amorphous. FIGS. 3a and 3b show auger electron spectra (AES) and X-ray photoelectron spectra (XPS) of the MOCVD $Al_2O_3$ film, and these spectra reveal the presence of aluminum, oxygen, and carbon. The carbon peaks shown in the AES and XPS were due to the carbon absorption on the specimen surface. However, after a 2 nm surface layer was removed from the film by argon ion (Ar) bombardments, the carbon peaks were no longer detected during the surface composition analyses. The inserts in FIG. 3b show the main peaks of oxygen and aluminum, from which the aluminum to oxygen atomic ratio (Al/O) was calculated to be 3:2, indicating a stoichiometry of $Al_2O_3$.

In a similar experiment, MOCVD $TiO_2$ thin films were deposited on (100) silicon wafers. In the experiment, titanium ethoxide was used as the metal organic precursor and it was kept in the bubbler at temperatures ranging from 100° C. to 125° C. Nitrogen was bubbled through the titanium ethoxide at a rate of 5 SCCM. In addition, 245 SCCM of $N_2$ was used as a diluting gas. With reference back to FIG. 1, it can be seen that control valves 45 and 46 for to separate nitrogen lines were operated in this deposition. The total chamber pressure was kept at 1 Torr and the silicon substrates were maintained at temperatures ranging between 380° C. and 420° C. throughout the deposition process. For these conditions, the MOCVD $TiO_2$ film growth rates were in the range of 4.0 to 6.0 nm/min.

Figure 4:
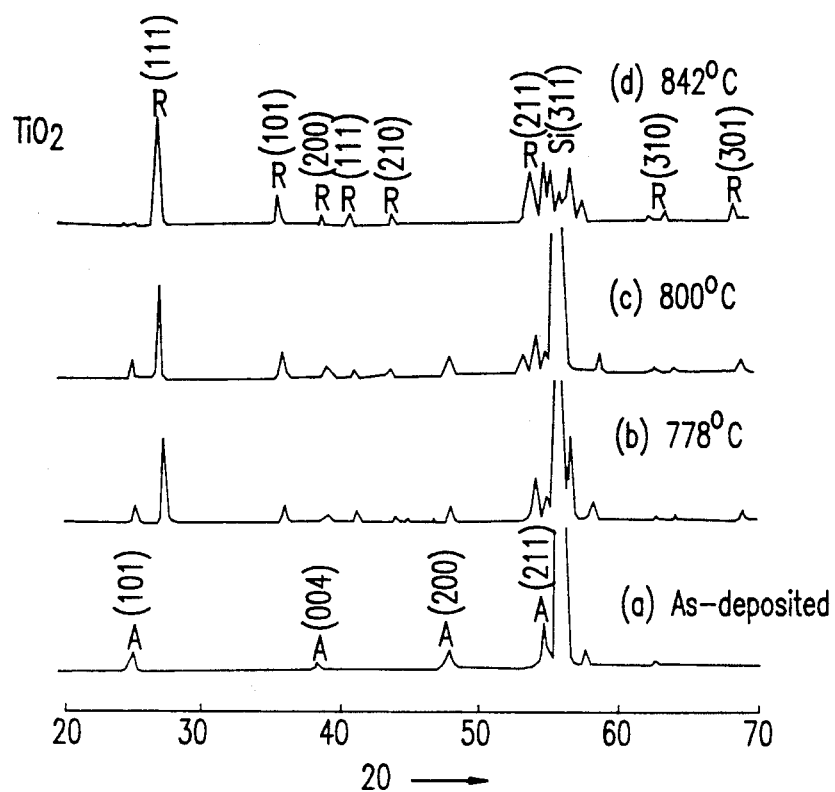
FIG. 4 are X-ray diffraction patterns of MOCVD $TiO_2$ films as-deposited and after subsequent heat treatments.

As with $Al_2O_3$, the MOCVD $TiO_2$ films were transparent, uniform, well adhering, and crack-free. These films showed very good specular reflection and had smooth surfaces as viewed by both optical microscopy and scanning electron microscopy (SEM). The X-ray diffraction pattern of the films showed that the MOCVD $TiO_2$ films were polycrystalline. When the substrate was kept below 400° C., the $TiO_2$ films were anatase. FIG. 4 shows the X-ray diffraction (XRD) patterns of as deposited and heat-treated $TiO_2$ films where the scans are indicated as (a) as deposited, (b) 775° C., (c) 800° C., and (d) 842° C. From FIG. 4, it can be seen that the anatase phase observed in the asdeposited film gradually transformed to a rutile phase as the $TiO_2$ was annealed at higher temperatures. The anatase-rutile transformation completed at 842° C. after thirty minutes.

Figure 5:
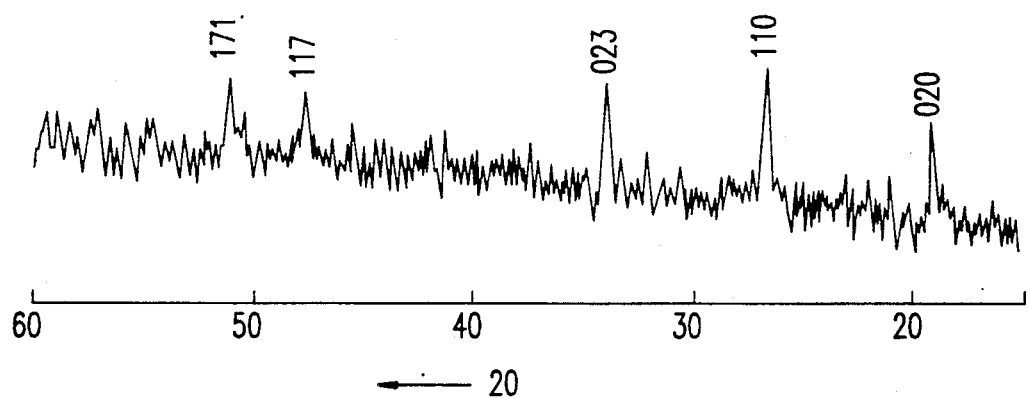
FIG. 5 is an X-ray diffraction pattern of an $Al_2TiO_5$ film formed by depositing MOCVD $TiO_2$ on sapphire followed by heating at 1400° C.

The formation of $Al_2TiO_5$ from $TiO_2$ and $Al_2O_3$ was observed when an MOCVD $TiO_2$ film was deposited onto a sapphire substrate (single crystal $Al_2O_3$), and was subsequently heat treated at 1400° C. for one hour. FIG. 5 is an XRD pattern of the sapphire substrate after film formation and heat treatment and shows that the $TiO_2$-film completely reacted with the sapphire substrate to form $Al_2TiO_5$ thin film. The XRD pattern shows that the $Al_2TiO_5$ was pure $\beta$-modification.

Additional experiments were conducted with SiC carbide filter elements that were on the order of one centimeter in cross-section. The SiC filter elements were comprised of a fibrous meshwork having an average pore size on the order of 100 $\mu m$. In these experiments, a $TiO_2$ layer was deposited by MOCVD using titanium ethoxide as a precursor as described above. Subsequently, an $Al_2O_3$ layer was applied over the $TiO_2$ by MOCVD using aluminum isopropoxide as a precursor as described above.

Figure 6A:
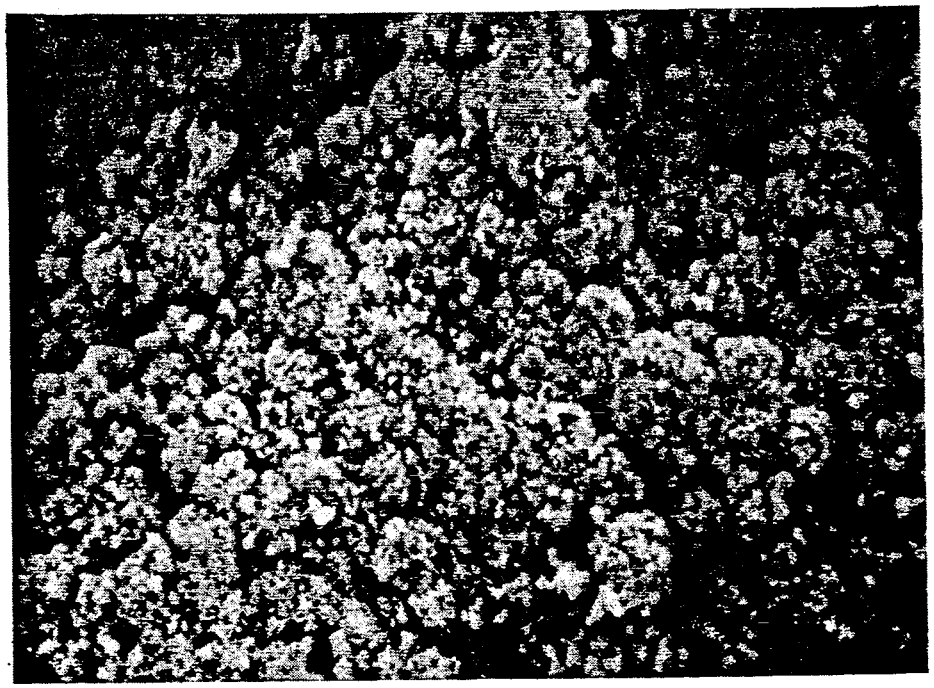
FIGS. 6a and 6b are scanning electron microscopy (SEM) photographs of the inner and outer surfaces of a porous SiC substrate where $TiO_2$ and $Al_2O_3$ films were deposited by MOCVD.
Figure 6B:
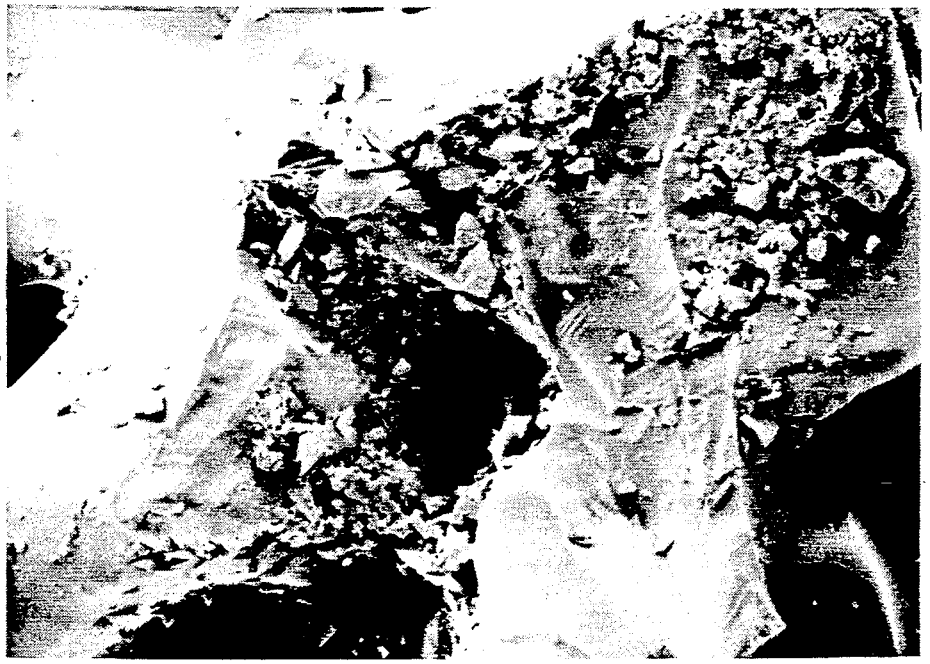

FIGS. 6a and 6b are SEM. photographs of the exposed outer surface of the filter element and a central inner surface of the filter element, respectively. The inner surface shown in FIG. 6b was obtained by slicing the filter element open and making an SEM of the inner fibers in the center of the filter. FIG. 6a shows that at high magnification, a cauliflower like film of $Al_2O_3$ is present on the surface of the SiC candle filter. FIG. 6b shows the walls of the pores coated by $TiO_2$ and $Al_2O_3$ films (especially highlighted by the arrow). The protective film coating was approximately 1 $\mu m$ thick and the pores in the SiC filter were not closed by the MOCVD coating process.

Figure 7A:
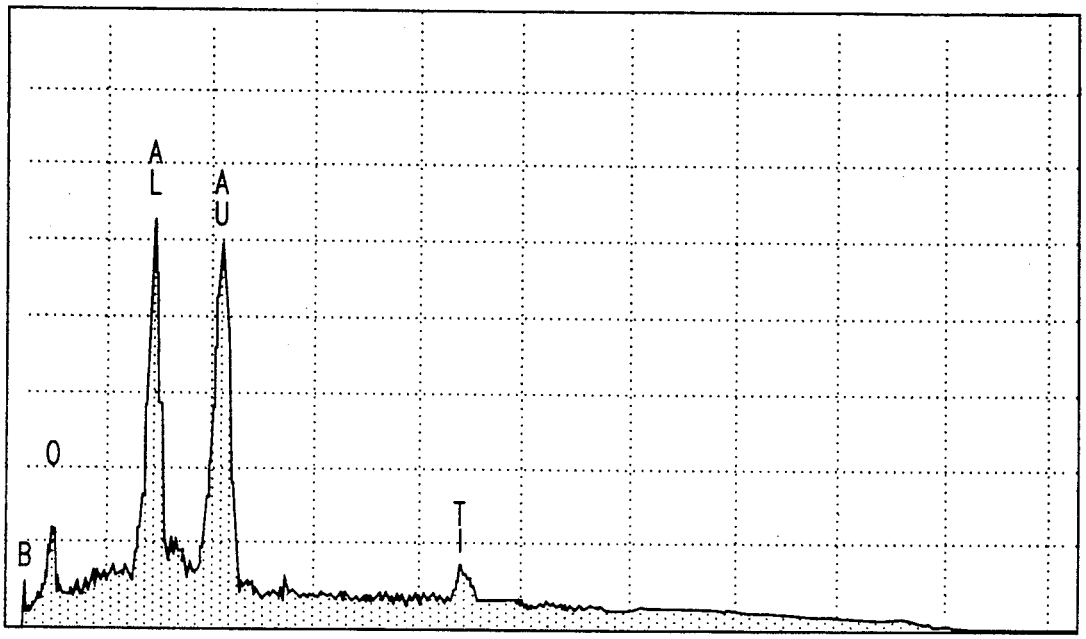
FIGS. 7a and 7b are energy dispersive x-ray analysis spectra of a porous SiC substrate having $TiO_2$, and $Al_2O_3$ films deposited thereon at both its surface and its interior cross-section, respectively.
Figure 7B:
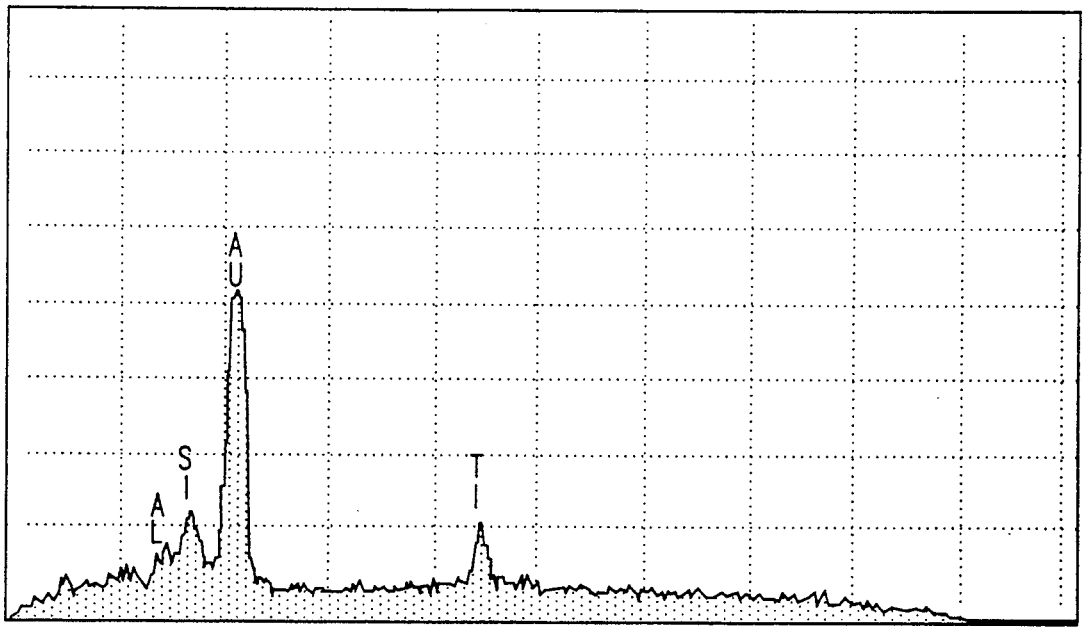

FIGS. 7a–b show dispersive x-ray analysis spectra (EDX) of the films at the surface and the interior of the SiC filter element, respectively. The spectra in FIGS. 7a and 7b correspond with the SEMs of FIGS. 6a and 6b. The aluminum and titanium peaks can be clearly seen in both FIGS. 7a and 7b; however, in the surface spectrum of FIG. 7a, the aluminum peak was much higher than the titanium peak. This is because the $TiO_2$ film was underneath the $Al_2O_3$ film in the sample. In contrast, the cross-section spectrum of FIG. 7b shows the aluminum peak is lower than the titanium peak. This indicates that the $Al_2O_3$ film on the free surface was thicker than on the pore surface. Nevertheless the thickness of the $TiO_2$ film was almost the same on both the free surface and pore surface.

According to the bulk densities of the metal oxides, which are 3.99 g/cm$^3$ for $\alpha$-$Al_2O_3$, 3.89 g/cm$^3$ for $TiO_2$ (anatase), and 3.70 g/cm$^3$ for $\beta$-$Al_2TiO_5$, the ratio of film thickness is calculated to be 52:42:100 for $\alpha$-$Al_2O_3$:-$TiO_2$:$\beta$-$Al_2TiO_5$. In order to form stoichiometric $\beta$-$Al_2TiO_5$, an 800 nm thick $TiO_2$ thin film and a 1000 nm thick $Al_2O_5$ thin film were deposited on a SiC substrate. The approximate film thickness of the resulting $Al_2TiO_5$ coating was 2$\mu m$. After annealing at 1400° C. for one hour, the x-ray diffraction pattern of the specimen showed the pure phase $\beta$-$Al_2TiO_5$. Neither $TiO_2$ nor $Al_2O_3$ peaks were found in the X-ray diffraction pattern.

The variation of aluminum oxide film thickness on the exterior surface and interior surface, as well as the uniform titanium oxide thickness on the exterior and interior surface, shown in FIGS. 7a and 7b may be explained by differences in film deposition mechanisms. Specifically, there are two film formation mechanisms at work in creating the metal oxide layers: a gas-phase reaction and a surface reaction. For the $TiO_2$ deposition, the films are formed mainly by the surface reaction, which means that the metal organic molecules reach the porous substrate surface, penetrate into the pores, and then oxidize/decompose to from the films. As explained above, decomposition is accomplished by heating the substrate to an elevated temperature. Because of this surface reaction mechanism where the metal organic reacts on the substrate surface only, films of the same thickness on the interior pore surfaces and the external free surfaces are achieved with $TiO_2$. Conversely, with MOCVD $Al_2O_3$, there is both a gas-phase reaction and a surface reaction. In the gas-phase reaction, a portion of the metal organic molecules decompose at a gas-phase stage before they reach the substrate and subsequently form the cauliflower-like film on the substrate surface shown in FIG. 6a. Large cauliflower-like particles have difficulty penetrating into the pores of the SiC filter, just as any other particle which the filter would be used to stop would have difficulty penetrating deep into the pores. Nevertheless, at least a portion of the aluminum isopropoxide precursors do not decompose at the gas-phase and react by a surface reaction. Hence, the inside of the pores is also coated with $Al_2O_3$ film.

In view of the above, when coating thicker porous ceramic substrates (on the order of several inches) with either a protective or catalytic layer of metal oxide or ceramic, it would be advantageous to choose organic precursors which are predominately surface reactive, such as $TiO_2$, since they are more amenable to penetrating deeply into a filter element. Organic precursors which have gas-phase reactions, such as $Al_2O_3$, will be less likely to coat the interior and exterior surfaces evenly. In addition, precursors which have gas phase reactions may lead to filter plugging as is evidenced by the cauliflower portions shown in FIG. 6a.

The choice of organic precursor can vary widely and will depend the type of element being made (e.g., filter or catalyst), as well as the dimensions of the element (e.g., precursors that undergo gas phase reactions may be suitable for relatively thin filter materials).

Figure 2:
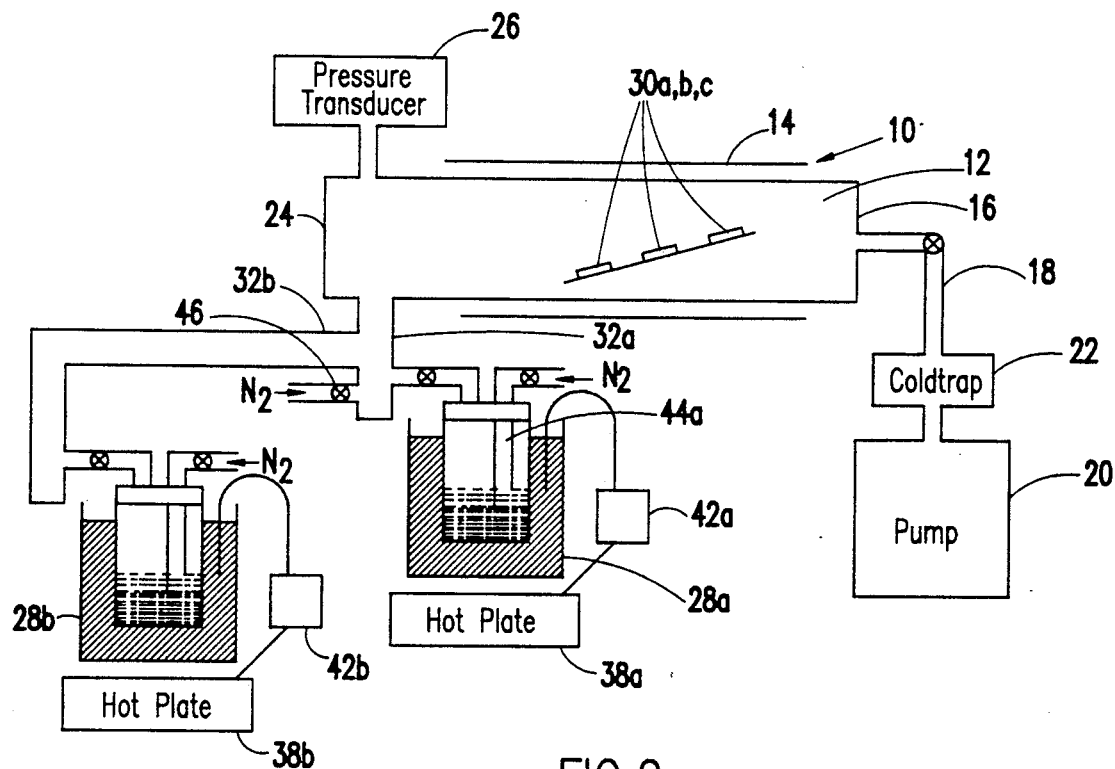
FIG. 2 is a schematic drawing of a CVD reactor showing the simultaneous and/or sequential deposition of two metal organic precursor compounds.

While the experiments with the SiC filters were conducted with a CVD reaction chamber similar to that shown in FIG. 1, where layers of $TiO_2$ and $Al_2O_3$ were deposited sequentially and then heat treated to form $\beta$-$Al_2TiO_5$, it should be understood that the MOCVD reactor could be modified to accommodate two or more bubblers for either simultaneous or sequential deposition of organic precursor compounds. For example, FIG. 2 shows bubblers 28a and 28b containing the metal organic precursor compounds aluminum propoxide and titanium ethoxide, respectively. The hot plates 38a and 38b are maintained at the optimum temperatures for each organic precursor using temperature controllers 42a and 42b. Nitrogen gas can be bubbled through each bubbler 28a and 28b using inlet tubes 44a and 44b. Passages 32a and 32b feed vaporized metal organic precursor compounds into the reaction chamber 12 under the influence of vacuum pump 20. Upon contacting the substrates 30a-c, the metal organic precursor compounds will decompose or otherwise be converted to their metal oxide. It is anticipated that the bubblers 28a and 28b could be operated simultaneously to deposit a homogenous $Al_2O_3$ and $TiO_2$ mixture on the substrate surface. Alternatively, bubbler 28a and bubbler 28b could be alternately operated to create sequential layers of $Al_2O_3$ and $TiO_2$ on the substrate 30a-c surfaces.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A method of coating $Al_2TiO_5$ on a substrate, comprising the steps of:
   placing a substrate in an environment which can be heated and evacuated to subatmospheric pressures;
   introducing a vaporized aluminum organic compound into said environment and allowing said vaporized aluminum organic compound to contact said substrate;
   introducing a vaporized titanium organic compound into said environment and allowing said vaporized titanium organic compound to contact said substrate;
   converting said aluminum organic compound and said titanium organic compounds to $Al_2O_3$ and $TiO_2$, respectively, on said substrate; and
   heating said substrate with said $Al_2O_3$ and said $TiO_2$ to a temperature and for a time sufficient to create $Al_2TiO_5$ on said substrate.

2. A method as recited in claim 1 wherein said steps of introducing said aluminum organic compound and introducing said titanium organic compound occur sequentially.

3. A method as recited in claim 1 wherein said steps of introducing said aluminum organic compound and introducing said titanium organic compound occur simultaneously.

4. A method as recited in claim 1 wherein said step of converting includes the step of heating said substrate to a temperature and for a time sufficient to create a layer of $Al_2O_3$ on a surface of said substrate from said aluminum organic compound.

5. A method as recited in claim 4 wherein said aluminum organic compound is aluminum isopropoxide.

6. A method as recited in claim 1 wherein said step of converting includes the step of heating said substrate to a temperature and for a time sufficient to create a layer of $TiO_2$ on a surface of said substrate from said titanium organic compound.

7. A method as recited in claim 6 wherein said titanium organic compound is titanium ethoxide 8. A method as recited in claim 1 wherein said step of heating is performed at approximately 1400° C. for approximately one hour.

9. A method of coating $Al_2TiO_5$ on a porous ceramic filter, comprising the steps of:
   placing a porous ceramic filter in an environment which can be heated and evacuated to subatmospheric pressures;
   introducing a vaporized aluminum organic compound into said environment and allowing said vaporized aluminum organic compound to permeate the pores of said porous ceramic filter and contact the interior and exterior surfaces of said porous ceramic filter;

introducing a vaporized titanium organic compound into said environment and allowing said vaporized titanium organic compound to permeate the pores of said porous ceramic filter and contact the interior and exterior surfaces of said porous ceramic filter;

converting said aluminum organic compound and said titanium organic compounds to $Al_2O_3$ and $TiO_2$, respectively, on said interior and exterior surfaces of said porous ceramic filter; and heating said porous ceramic filter with said $Al_2O_3$ and said $TiO_2$ to a temperature and for a time sufficient to create $Al_2TiO_5$ on said porous ceramic filter.

10. A method as recited in claim 9 wherein said steps of introducing said aluminum organic compound and introducing said titanium organic compound occur sequentially.

11. A method as recited in claim 9 wherein said steps of introducing said aluminum organic compound and introducing said titanium organic compound occur simultaneously.

12. A method as recited in claim 9 wherein said step of converting includes the step of heating said porous ceramic filter to a temperature and for a time sufficient to create a layer of $Al_2O_3$ on said interior and exterior surfaces of said porous ceramic filter from said aluminum organic compound.

13. A method as recited in claim 12 wherein said aluminum organic compound is aluminum isopropoxide.

14. A method as recited in claim 9 wherein said step of converting includes the step of heating said porous ceramic filter to a temperature and for a time sufficient to create a layer of $TiO_2$ on said interior and exterior surfaces of said porous ceramic filter from said titanium organic compound.

15. A method as recited in claim 14 wherein said titanium organic compound is titanium ethoxide.

16. A method as recited in claim 9 wherein said step of heating is performed at approximately 14000° C. for approximately one hour.

17. A method for creating an $Al_2TiO_{25}$ film, comprising the steps of:

providing a sapphire substrate;
vaporizing a titanium organic compound;
depositing the vaporized titanium organic compound on said sapphire substrate;
converting said titanium organic compound deposited on said substrate to $TiO_2$; and
heating said sapphire substrate to a temperature and for a time sufficient to react said sapphire substrate with said $TiO_2$ to form $AlTiO_5$.

18. A method as recited in claim 17 wherein said titanium organic compound is titanium ethoxide.

19. A method as recited in claim 17 wherein said heating step is performed at approximately 1400° C. for approximately one hour.

20. a method of coating a porous material with a metal oxide or ceramic layer, comprising the steps of:

placing a porous material having a pore size on the order of 100 μm in an environment which can be heated and evacuated to subatmospheric pressures;

introducing at least two different vaporized metal or ceramic organic precursor compounds into said environment using vacuum pressure;

allowing said two different vaporized metal or ceramic organic precursor compounds to permeate into pores in said porous material; and converting said metal or ceramic organic precursor compounds into a combined metal oxide or ceramic on internal and external surfaces of said porous material.

21. A method as recited in claim 20 wherein said step of introducing includes the step of bubbling nitrogen gas through said metal or ceramic organic precursor compound when said metal or ceramic organic precursor compouond is in a liquid state.

22. A method as receited in claim 20 wherein said metal or ceramic organic precursor compound is selected from the group consisting of $Al(C_3H_7O)_3$, $[ZR(C_{11}H_{19}O_2)_4]$, $[ZR(C_4H_9O)_4]$, $[Ti(C_3H_7O)_4]$, $[Y(C_{11}H_{19}O_2)_3]$, $[SC(C_{11}H_{19}O_2)_3]$, $[SR(C_{11}H_{19}O_2)_2]$, $[Ta(C_2H_5O)_5]$, $[Ca(C_{11}H_{19}O_2)_2]$, $Si[N(CH_3)_2]_4$, $Ti[N(CH_3)_2]_4$, $Zr[N(C_2H_5)_2]_4$, $[(CH_3)_2AlNH_2]_3$, $CH_3SiCl_3$, $C_2H_5TiCl_3$, and $C_5H_5ZrCl_3$.

23. A method as recited in claim 20 wherein said metal or ceramic organic precursor compounds primarily react by surface reaction on said porous material.

24. A method as recited in claim 23 wherein said metal or ceramic organic precursor compound is $Ti(C_3H_7O)_4$.

* * * * *